(12) United States Patent
Tanaka (10) Patent No.: US 7,535,712 B2
(45) Date of Patent: May 19, 2009

(54) ELECTRONIC APPARATUS

(75) Inventor: Makoto Tanaka, Oume (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 11/803,446

(22) Filed: May 14, 2007

(65) Prior Publication Data

US 2007/0279868 A1    Dec. 6, 2007

(30) Foreign Application Priority Data

May 30, 2006   (JP)   ............ P2006-150034

(51) Int. Cl.
*H05K 7/20*   (2006.01)

(52) U.S. Cl. .............. 361/700; 257/715; 174/15.2; 165/104.26; 165/104.33

(58) Field of Classification Search .............. None
See application file for complete search history.

(56) References Cited

U.S. PATENT DOCUMENTS

| | | | | |
|---|---|---|---|---|
| 5,581,443 | A | * | 12/1996 | Nakamura et al. ......... 361/705 |
| 5,764,483 | A | | 6/1998 | Ohashi et al. |
| 6,006,827 | A | | 12/1999 | Lu |
| 6,069,791 | A | | 5/2000 | Goto et al. |
| 6,082,443 | A | | 7/2000 | Yamamoto et al. |
| 6,160,223 | A | * | 12/2000 | Gates .................... 174/252 |
| 6,535,386 | B2 | * | 3/2003 | Sathe et al. .............. 361/700 |
| 6,650,540 | B2 | | 11/2003 | Ishikawa |
| 6,804,115 | B2 | | 10/2004 | Lai |
| 6,940,717 | B2 | | 9/2005 | Shih-Tsung |
| 7,079,394 | B2 | | 7/2006 | Mok |
| 2006/0077637 | A1 | | 4/2006 | Ishikawa |
| 2008/0093056 | A1 | | 4/2008 | Hwang et al. |

FOREIGN PATENT DOCUMENTS

| | | |
|---|---|---|
| JP | H03-3794 | 1/1991 |
| JP | 08-286783 | 11/1996 |
| JP | 2001-119183 | 4/2001 |
| JP | 2003-101272 | 4/2003 |
| JP | 2003-258472 | 9/2003 |
| JP | 2004-31606 | 1/2004 |

OTHER PUBLICATIONS

English abstract translation of Japanese application No. H03-379, Published Jan. 16, 1991.

* cited by examiner

*Primary Examiner*—Boris L Chervinsky
(74) *Attorney, Agent, or Firm*—Blakely, Sokoloff, Taylor & Zafman LLP (57) ABSTRACT

According to one embodiment, an electronic apparatus comprising: a housing; a circuit board that is housed in the housing; a heat generation portion that is mounted on the circuit board; a heat radiation portion that is housed in the housing; a first conductor layer that is provided on the circuit board; a heat reception portion that is thermally connected to the heat generation portion; a heat pipe that is fixed to the first conductor layer; and a fixing member that mounts the heat reception portion on the circuit board, wherein the heat pipe includes a first end portion fixed to the heat reception portion, and a second end portion thermally connected to the heat radiation portion.

12 Claims, 9 Drawing Sheets

ELECTRONIC APPARATUS

CROSS-REFERENCE TO RELATED APPLICATIONS

This application is based upon and claims the benefit of priority from Japanese Patent Application No. 2006-150034, filed May 30, 2006, the entire contents of which are incorporated herein by reference.

BACKGROUND

1. Field

One embodiment of the invention relates to an electronic apparatus including a circuit board and in particular to a reinforcement structure of a circuit board.

2. Description of the Related Art

For example, an electronic machine of a portable computer includes a circuit board in a cabinet. In recent years, the electronic machine has been furthermore miniaturized and slimmed down. Thus, often the circuit board has a complicatedly cut out shape from the limitations on the unit layout in the cabinet and the appearance of the machine.

Such a circuit board cut out to a complicated shape may have a portion where the width narrows and the mechanical strength weakens in a part of the circuit board, for example. If the circuit board contains a weak portion in strength, when a physical stress is applied to the circuit board, it is feared that a break may occur in the wiring pattern of the portion or that a connection failure of the mounted circuit parts may be caused to occur.

For example, a reinforcement structure for reinforcing a circuit board with a heat pipe is disclosed in JP-UM-A-3-3794. The reinforcement structure described in JP-UM-A-3-3794 has a circuit board, a heat transfer block, a heat sink, and a heat pipe. The heat transfer block has heating parts mounted thereon in an intimate contact manner and is fixed to one end of the circuit board. The heat sink is fixed to an opposite end of the circuit board. The heat pipe is attached to the heat transfer block and the heat sink. The circuit board is reinforced by the rigidity of the heat pipe. Further, a support for supporting the heat pipe is attached to the circuit board.

For example, heating parts such as a CPU have generated higher heat in recent years. For example, the heat of the heating parts described in patent document 1 is dissipated by the heat sink. However, a reinforcement structure of a circuit board intended not only for reinforcing the circuit board, but also improving the cooling efficiency of the heating parts is desired with higher heat generation of the heating parts.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an electronic apparatus comprising: a housing; a circuit board that is housed in the housing; a heat generation portion that is mounted on the circuit board; a heat radiation portion that is housed in the housing; a first conductor layer that is provided on the circuit board; a heat reception portion that is thermally connected to the heat generation portion; a heat pipe that is fixed to the first conductor layer; and a fixing member that mounts the heat reception portion on the circuit board, wherein the heat pipe includes a first end portion fixed to the heat reception part, and a second end portion thermally connected to the heat radiation portion.

Figure 1:
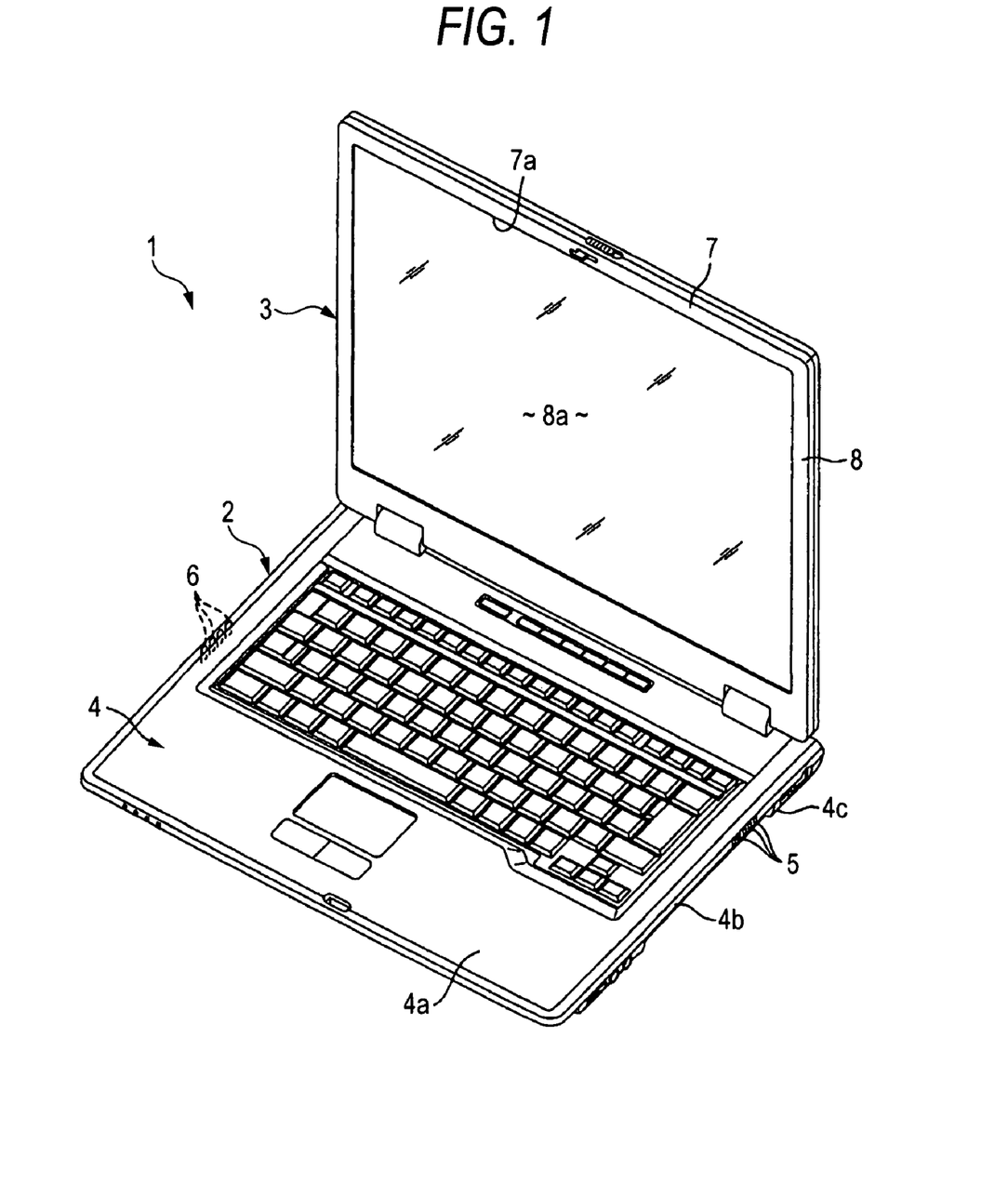
FIG. 1 is an exemplary perspective view of a portable computer according to a first embodiment of the invention.

Embodiments of the invention will be discussed based on the accompanying drawings incorporating a portable computer. FIGS. 1 to 5 disclose a portable computer 1 as an electronic machine according to a first embodiment of the invention. As shown in FIG. 1, the portable computer 1 includes a main unit 2 and a display unit 3. The main unit 2 includes a box-like cabinet 4. The cabinet 4 has an upper wall 4a, a peripheral wall 4b, and a lower wall 4c. The cabinet 4 has openings of suction holes 5 and exhaust holes 6.

The display unit 3 includes a display housing 7 and a liquid crystal display panel 8 housed in the display housing 7. The liquid crystal display panel 8 has a display screen 8a. The display screen 8a is exposed to the outside of the display housing 7 through an opening 7a on the front of the display housing 7.

The display unit 3 is supported through hinge devices in the rear end part of the cabinet 4. Thus, the display unit 3 can rotate between a closed position where the display unit 3 is tilted so as to cover the upper wall 4a from above and an open position where the display unit 3 is raised so as to expose the upper wall 4a.

Figure 2:
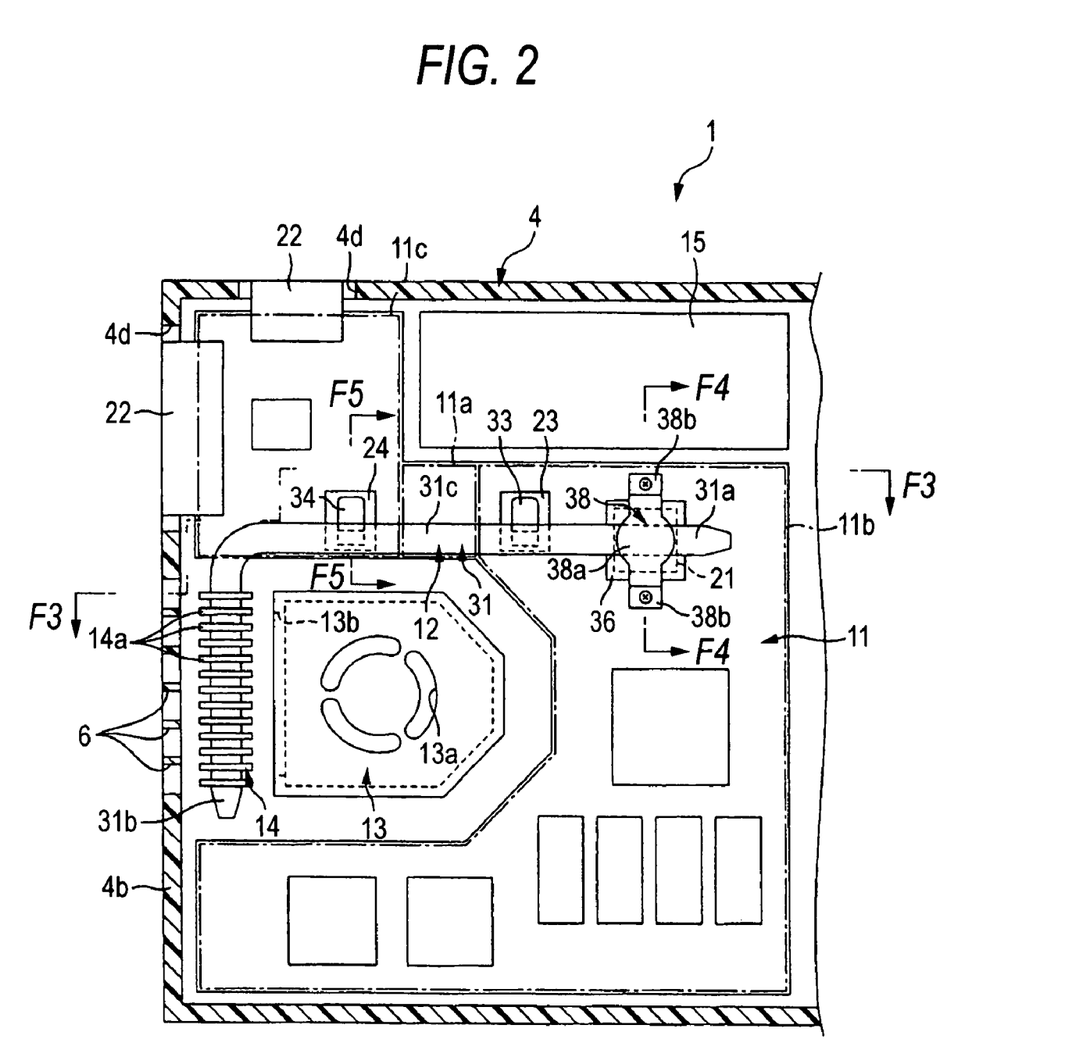
FIG. 2 is an exemplary sectional view of the portable computer according to the first embodiment of the invention.

As shown in FIG. 2, the cabinet 4 houses a circuit board 11, a heat pipe 12, a cooling fan 13, a heat dissipation member 14, and a battery unit 15.

The exhaust holes 6 are opened in the peripheral wall 4b of the cabinet 4. The cooling fan 13 is placed facing the exhaust holes 6. The cooling fan 13 has an air inlet 13a and an air outlet 13b. The air outlet 13b of the cooling fan 13 is opposed to the exhaust holes 6 of the peripheral wall 4b. The cooling fan 13 sucks air in the cabinet 4 through the air inlet 13a and ejects the sucked air toward the exhaust holes 6 through the air outlet 13b.

The heat dissipation member 14 is placed between the air outlet 13b of the cooling fan 13 and the exhaust holes 6 of the peripheral wall 4b. The heat dissipation member 14 has a plurality of fin elements 14a shaped like plates. Each fin element 14a is formed of an aluminum alloy, etc., excellent in heat transfer property, for example. The fin elements 14a are arranged so that their planes are along the air ejection direction of the cooling fan 13, and are spaced from each other with a gap.

The battery unit 15 is placed along the peripheral wall 4b of the rear end part of the cabinet 4, for example.

The circuit board 11 has a size covering the full width of the cabinet 4, for example. The circuit board 11 is cut out so as to circumvent the cooling fan 13, the heat dissipation member 14, and the battery unit 15 and is placed circumventing the components 13, 14, and 15, for example.

Thus, as shown in FIG. 2, the circuit board 11 according to the embodiment has a narrow portion 11a where the board width is narrow and is constricted as compared with other portions between the cooling fan 13 and the battery unit 15, for example. The narrow portion 11a is an example of a part weak in mechanical strength in the circuit board 11 as compared with other portions. The cooling fan 13 or the like is an example of an element for forming the circuit board 11 with the narrow portion 11a, and the circuit board 11 may have the narrow portion 11a because of the limitations on the appearance of the machine, for example, or for any other reason.

As shown in FIG. 2, the circuit board 11 has a first area 11b connecting to one end of the narrow portion 11a and a second area 11c connecting to an opposite end of the narrow portion 11a. The first area 11b is positioned at the center in the cabinet 4, for example, and a heating part 21 is installed in the first area 11b. The heating part 21 is a CPU, a north bridge, a memory chip, etc., by way of example. However, the heating part 21 may be any if it is a part generating heat when the portable computer 1 is used.

On the other hand, the second area 11c is positioned in a marginal part in the cabinet 4 and an external insertion/removal part 22, for example, is installed in the second area 11c. The external insertion/removal part 22 is exposed to the outside of the cabinet 4 through an opening 4d of the cabinet 4 and the user can attach and detach a cable, etc., as desired, for example. The external insertion/removal part 22 is an example of the parts installed in the second area 11c and may be a connector not exposed to the outside of the cabinet 4 or any other circuit part, for example. For example, when the user inserts or extracts a cable, etc., into or from the external insertion/removal part 22, a stress is applied to the narrow portion 11a of the circuit board 11.

As shown in FIG. 2, first and second conductor layers 23 and 24, for example, are provided on the surface of the circuit board 11. The first and second conductor layers 23 and 24 are copper foil by way of example. They are exposed to the outside of the circuit board 11. The first and second conductor layers 23 and 24 are ground layers. The location where the first and second conductor layers 23 and 24 are provided may be not only the upper face of the circuit board 11, but also the lower face; the first and second conductor layers 23 and 24 may be provided anywhere if they are provided on the surface of the circuit board 11.

The first conductor layer 23 is formed in the first area 11b. More particularly, the first conductor layer 23 is placed at a position entering the side of the first area 11b a little from the boundary between the narrow portion 11a and the first area 11b. The second conductor layer 24 is formed in the second area 11c. More particularly, the second conductor layer 24 is placed at a position entering the side of the second area 11c a little from the boundary between the narrow portion 11a and the second area 11c.

Next, the heat pipe 12 will be discussed in detail with reference to FIGS. 2 to 5.

As shown in FIG. 2, the heat pipe 12 has a main body 31 and first and second attachment parts 33 and 34 fixed to the conductor layers 23 and 24. The main body 31 of the heat pipe 12 has a pipe-like container with both end parts closed. An example of the material of the container is a copper alloy. The container is formed on an inner wall with a wick and a liquid refrigerant is sealed in the container. If one end part of the heat pipe 12 is exposed to a high temperature, some of the liquid refrigerant is evaporated and moves to an opposite end part. The vapor-like liquid refrigerant moved to the opposite end part dissipates heat and condenses in the opposite end part. The condensed liquid refrigerant returns to the end part exposed to the high temperature because of a capillary phenomenon. Such a cycle is repeated in the heat pipe 12 and the liquid refrigerant is circulated.

Figure 3:
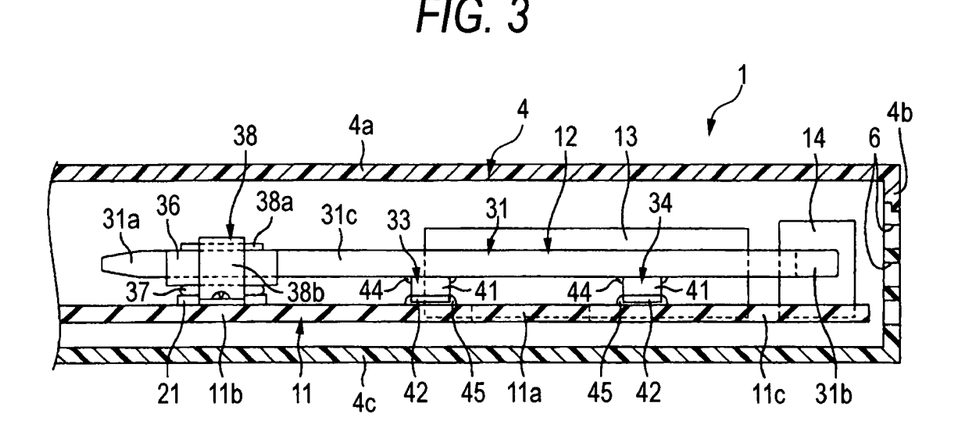
FIG. 3 is an exemplary sectional view of the portable computer taken along line F3-F3 in FIG. 2.
Figure 4:
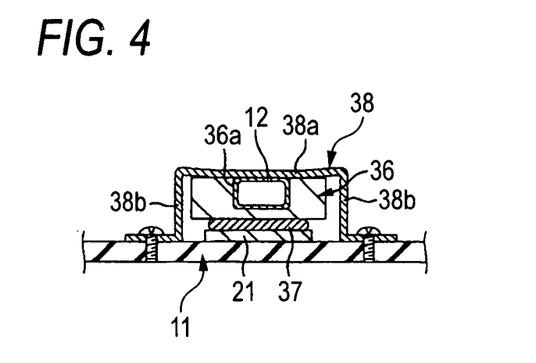
FIG. 4 is an exemplary sectional view of the portable computer taken along line F4-F4 in FIG. 2.

The main body 31 of the heat pipe 12 has a first end part 31a as a heat reception end part, a second end part 31b as a heat dissipation part, and a center part 31c positioned between the first end part 31a and the second end part 31b. The first end part 31a of the main body 31 is thermally connected to the heating part 21. Specifically, a heat reception block 36 is placed on the heating part 21 as shown in FIGS. 3 and 4. The heat reception block 36 is an example of a heat reception member.

The heat reception block 36 is formed of an aluminum alloy, etc., excellent in thermal conductivity, for example. A heat transfer member 37 is interposed between the heating part 21 and the heat reception block 36. The heat transfer member 37 is formed of a member having high thermal conductivity and having elasticity, for example. The heat transfer member 37 is a heat transfer sheet, grease, etc., by way of example. The heat reception block 36 is thermally connected to the heating part 21 through the heat transfer member 37.

As shown in FIG. 4, a groove 36a is formed on the top of the heat reception block 36. The heat pipe 12 is fitted into the groove 36a, whereby it is fixed to the heat reception block 36. The heat reception block 36 is mounted on the circuit board 11 with a fixing member 38. The fixing member 38 attaches the heat pipe 12 and the heat reception block 36 collectively, for example, onto the heating part 21.

The fixing member 38 has a cover part 38a and leg parts 38b. The cover part 38a covers a part of the top of the heat pipe 12. The leg parts 38b extend from both end parts of the cover part 38a toward the circuit board 11 and are screwed to the circuit board 11. In other words, the heat pipe 12 is indirectly fixed to the circuit board 11.

The fixing member 38 is formed of metal, etc., for example, having elasticity. It presses the heat pipe 12 and the heat reception block 36 against the circuit board 11. The fixing member 38 has elasticity and allows play in the direction in which the heat pipe 12 is away from the circuit board 11.

The heat pipe 12 supports the first area 11b of the circuit board 11 through the heat reception block 36 and the fixing member 38.

As shown in FIG. 2, the second end part 31b of the main body 31 extends to the heat dissipation member 14 and is thermally connected to the heat dissipation member 14. More particularly, the fin elements 14a of the heat dissipation member 14 have each an opening. Each of the fin elements 14a has the opening fitted into the heat pipe 12. In other words, the fin elements 14a are fitted into the heat pipe 12, whereby the heat dissipation member 14 is formed.

As shown in FIG. 2, the center part 31c of the main body 31 extends so as to pass through above the narrow portion 11a of the circuit board 11. That is, the heat pipe 12 extends from the first area 11b of the circuit board 11 to the second area 11c. As shown in FIG. 3, the first end part 31a, the second end part 31b, and the center part 31c of the main body 31 are placed with a given gap from the circuit board 11. That is, the main body 31 of the heat pipe 12 extends along the parallel direction with the plane of the circuit board 11.

As shown in FIGS. 2 and 3, the first and second attachment parts 33 and 34 of the heat pipe 12 are provided in the center part 31c of the main body 31. The first attachment part 33 is provided at a position opposed to the first conductor layer 23 provided on the circuit board 11. The second attachment part 34 is provided at a position opposed to the second conductor layer 24 provided on the circuit board 11.

Figure 5:
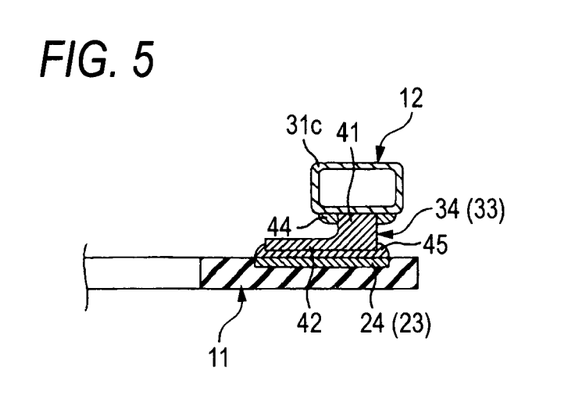
FIG. 5 is an exemplary sectional view of the portable computer taken along line F5-F5 in FIG. 2.

The first and second attachment parts 33 and 34 are formed of the same material as the container of the main body 31, namely, a copper alloy. As shown in FIG. 5, each of the first and second attachment parts 33 and 34 has an extension part 41 and a joint part 42. The extension parts 41 of the first and second attachment parts 33 and 34 extend from the lower face of the main body 31 toward the circuit board 11. Each joint part 42 extends along the plane of the circuit board 11 from the tip of the extension part 41.

The first and second attachment parts 33 and 34 are provided separately from the heat pipe 12, for example. The first and second attachment parts 33 and 34 are soldered by solder 44, for example, whereby it is fixed to the main body 31. However, the fixing method of the attachment parts 33 and 34 to the main body 31 is not limited to soldering and may be welding or fitting, for example. Further, the attachment parts 33 and 34 may be molded integral with the main body 31 with a mold.

The joint parts 42 of the first and second attachment parts 33 and 34 are soldered by soldering 45, for example, whereby they are joined to the first and second conductor layers 23 and 24 provided on the circuit board 11. Accordingly, the heat pipe 12 is fixed to the first and second conductor layers 23 and 24 and is thermally and electrically connected to the first and second conductor layers 23 and 24. That is, the heat pipe 12 is grounded to the conductor layers 23 and 24 through the attachment parts 33 and 34.

The heat pipe 12 is fixed directly or indirectly to the circuit board 11 at the three points of the first end part 31a, the first attachment part 33, and the second attachment part 34. As shown in FIG. 2, the first end part 31a and the first attachment part 33 are fixed to the first area 11b of the circuit board 11. The second attachment part 34 is fixed to the second area 11c of the circuit board 11.

Accordingly, the heat pipe 12 is connected to both of the first area 11b and the second area 11c physically (namely, structurally). The heat pipe 12 supports the first area 11b of the circuit board 11 through the fixing member 38 and the conductor layer 23. The heat pipe 12 supports the second area 11c of the circuit board 11 through the conductor layer 24. That is, it intervenes between the first area 11b and the second area 11c of the circuit board 11 for reinforcing the narrow portion 11a.

Figure 6:
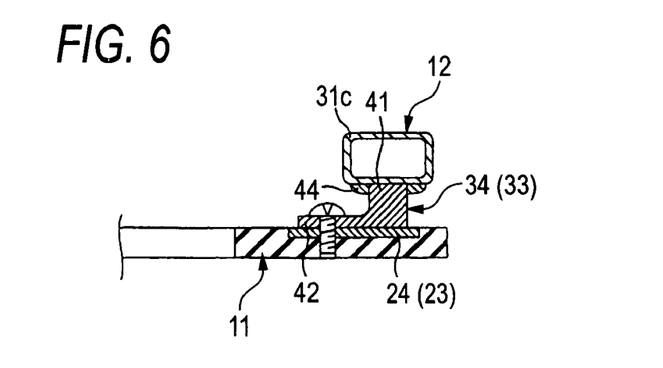
FIG. 6 is an exemplary sectional view of a modified example of the portable computer according to the first embodiment of the invention.

The fixing method of the joint parts 42 to the conductor layers 23 and 24 is not limited to soldering and the joint parts 42 may be fastened to the conductor layers 23 and 24 with a screw, for example, as shown in FIG. 6. If the attachment parts 33 and 34 are fastened to the conductor layers 23 and 24 with a screw, attachment and detachment are easy, contributing to shortening the manufacturing time and the machine disassembly capability of the portable computer 1.

Next, the function of the portable computer 1 will be discussed.

To use the portable computer 1, the heating part 21 generates heat. The heat generated in the heating part 21 is transferred through the heat transfer member 37 and the heat reception block 36 to the first end part 31a of the heat pipe 12. A part of the heat transferred to the first end part 31a moves to the second end part 31b through vaporization and condensation of hydraulic fluid. The heat moving to the second end part 31b is ejected to the outside of the cabinet 4 by the action of the heat dissipation member 14 and the cooling fan 13.

A part of the heat transferred to the first end part 31a of the heat pipe 12 is transferred to the circuit board 11 through the first and second attachment parts 33 and 34 and the first and second conductor layers 23 and 24 of the heat pipe 12. The heat transferred to the circuit board 11 is diffused to the whole of the circuit board 11 and the circuit board 11 functions as a heat sink and thus is dissipated in the cabinet 4. The heat dissipated in the cabinet 4 is ejected to the outside of the cabinet 4 as the air absorbing the heat is ejected to the outside of the cabinet 4 by the cooling fan 13.

The heating part 21 produces electromagnetic noise during the operation. The noise is propagated to the first end part 31a of the heat pipe 12. The noise propagated to the heat pipe 12 is absorbed in the conductor layers 23 and 24 of ground layers through the first and second attachment parts 33 and 34.

On the other hand, for example, static electricity enters the cabinet 4 from the outside of the cabinet 4 through the exhaust holes 6 of the peripheral wall 4b and charges in the second end part 31b of the heat pipe 12. The static electricity charging in the second end part 31b is absorbed in the conductor layers 23 and 24 of ground layers through the first and second attachment parts 33 and 34.

According to the described portable computer 1, the circuit board 11 is reinforced and the cooling efficiency of the heating part 21 improves. That is, the heat pipe 12 is attached to the circuit board 11 by means of the heat reception block 36 and the fixing member 38 and is fixed to the conductor layers 23 and 24 provided on the circuit board 11, whereby the circuit board 11 is reinforced by the rigidity of the heat pipe 12. Accordingly, the need for providing the circuit board 11 with an additional reinforcement member is eliminated and the portable computer 1 can be miniaturized and the cost of the portable computer 1 can be reduced.

The heat generated from the heating part 21 is dissipated from the heat dissipation member 14 and is also transferred to the circuit board 11 through the conductor layers 23 and 24 to which the heat pipe 12 is fixed. The heat transferred to the circuit board 11 is diffused in the circuit board 11 and is dissipated from the circuit board 11. That is, two heat dissipation channels are formed, so that the cooling efficiency of the heating part 21 improves.

Further, the conductor layers 23 and 24 are ground layers and when the heat pipe 12 is grounded through the conductor layers 23 and 24, the portable computer 1 for which radio wave suppression is contrived and static electricity countermeasures are taken can be provided. That is, the noise produced by the heating part 21 is absorbed in the conductor layers 23 and 24, so that suppression of unnecessary radiation (electro magnetic interface: EMI) is contrived. The static electricity entering from the outside of the cabinet 4 is absorbed in the conductor layers 23 and 24 before propagation to the heating part 21, so that static electricity countermeasures are taken.

When the first end part 31a of the heat pipe 12 supports the first area 11b of the circuit board 11 and the second attachment part 34 supports the second area 11c, the first area 11b and the second area 11c are mutually supported through the heat pipe 12. Accordingly, concentrating of the stress applied to the first or second area 11b or 11c on the narrow portion 11a is suppressed. Accordingly, if the strength of the narrow portion 11a is somewhat low, resistance of the circuit board 11 to external stress improves.

When the fixing member 38 for fixing the first end part 31a of the heat pipe 12 allows play, if the heat pipe 12 is attached to the conductor layers 23 and 24, it becomes hard to apply unnecessary stress to the circuit board 11.

When the heat pipe 12 has the attachment parts 33 and 34 extending from the main body 31 toward the circuit board 11, the main body 31 can be extended along the parallel direction with the plane of the circuit board 11 without bending the main body 31 in an up and down direction, so that the manufacturing property of the portable computer 1 is good.

When the conductor layers 23 and 24 are placed separately in the first area 11b and the second area 11c of the circuit board 11 and the attachment parts 33 and 34 of the heat pipe 12 are fixed to the conductor layers 23 and 24, the first area 11b and the second area 11c are mutually supported through the heat pipe 12. Accordingly, concentrating of the stress applied to the first or second area 11b or 11c on the narrow portion 11a is suppressed.

When the heat pipe 12 is fixed to the conductor layers 23 and 24 by the soldering 45, a fixing member such as a screw, for example, can be omitted. When the attachment parts 33 and 34 of the heat pipe 12 are formed of the same material as the main body 31, the heat transfer efficiency from the heat pipe 12 to the conductor layers 23 and 24 is high.

The number of the attachment parts 33 and 34 of the heat pipe 12 and the number of the conductor layers 23 and 24 provided on the circuit board 11 are not limited to two and may be three or more. When the first end part 31a of the heat pipe 12 is fixed to the first area 11b of the circuit board 11, the first attachment part 33 of the heat pipe 12 and the first conductor layer 23 provided on the circuit board 11 may be omitted. If the first attachment part 33 is omitted, the narrow portion 11a of the circuit board 11 can be reinforced.

On the other hand, if the first attachment part 33 is provided, the fixing member 38 for fixing the first end part 31a of the heat pipe 12 is not necessarily required. The first attachment part 33 is fixed to the first area 11b of the circuit board 11 and the second attachment part 34 is fixed to the second area 11c, whereby the narrow portion 11a can be reinforced. However, if the fixing member 38 is provided, the first end part 31a of the heat pipe 12 is pressed against the heating part 21, so that the heat transfer efficiency therebetween improves.

Figure 7:
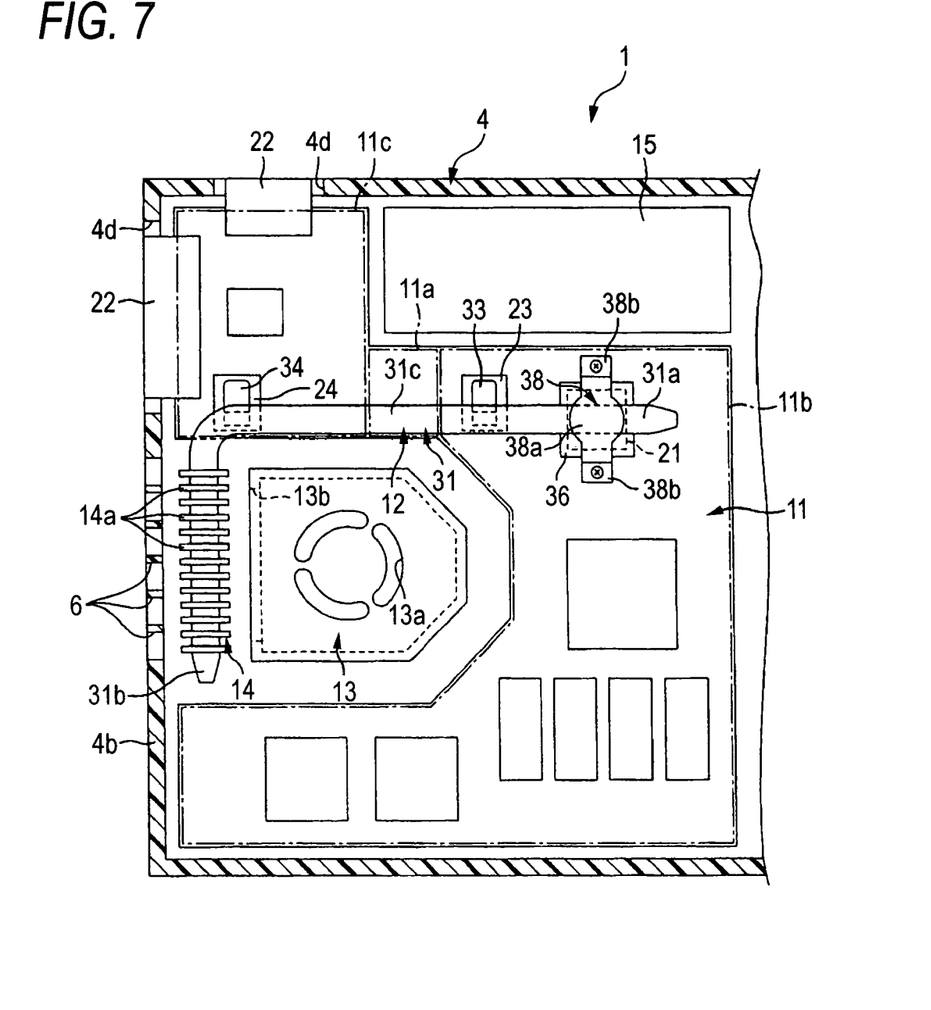
FIG. 7 is an exemplary sectional view of another modified example of the portable computer according to the first embodiment of the invention.

FIG. 7 shows a modified example of the portable computer 1. As shown in FIG. 7, if the second attachment part 34 of the heat pipe 12 and the second conductor layer 24 provided on the circuit board 11 are placed near the exhaust holes 6, static electricity entering from the exhaust holes 6 can be absorbed early, so that static electricity countermeasures improve.

Next, a portable computer 51 as an electronic machine according to a second embodiment of the invention will be discussed with reference to FIGS. 8 and 9. Components identical with those of the portable computer 1 according to the first embodiment are denoted by the same reference numerals in the second embodiment and will not be discussed again.

Figure 8:
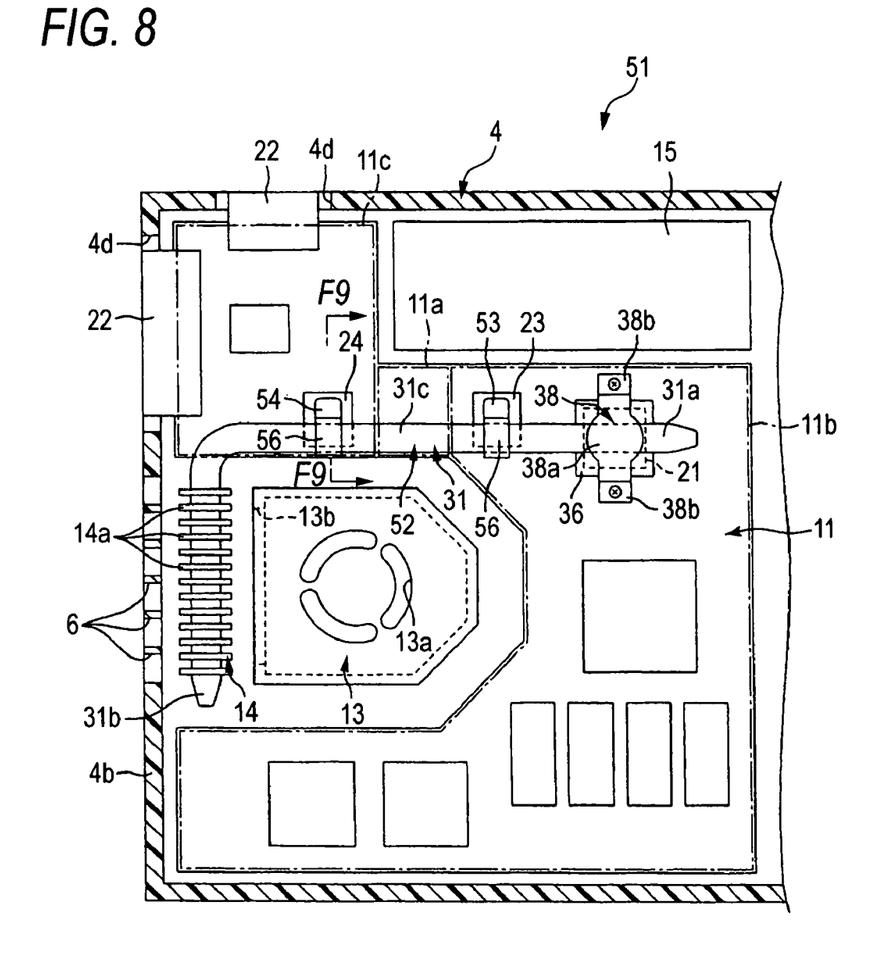
FIG. 8 is an exemplary sectional view of a portable computer according to a second embodiment of the invention.
Figure 9:
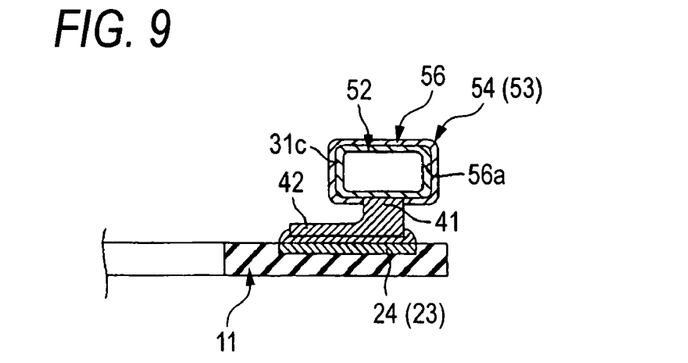
FIG. 9 is an exemplary sectional view of the portable computer taken along line F9-F9 in FIG. 8.

As shown in FIG. 8, a cabinet 4 of the portable computer 51 houses a circuit board 11, a cooling fan 13, a heat dissipation member 14, and a heat pipe 52. The heat pipe 52 has a main body 31. A first end part 31a of the main body 31 is attached to the circuit board 11 by means of a heat reception block 36 and a fixing member 38 and supports a first area 11b of the circuit board 11 through the fixing member 38. The heat pipe 52 extends with a gap from the circuit board 11. The heat pipe 52 according to the embodiment does not have attachment part 33 or 34.

The portable computer 51 further has first and second fixing members 53 and 54 for fixing the heat pipe 52 to conductor layers 23 and 24. As shown in FIG. 9, first and second fixing members 53 and 54 have each a fit part 56, an extension part 41, and a joint part 42. The fit part 56 has an opening 56a roughly the same as the outer shape of the main body 31 of the heat pipe 52. The heat pipe 52 is fitted into the opening 56a, whereby the first and second fixing members 53 and 54 are fixed to the heat pipe 52. The heat pipe 52 supports the first area 11b of the circuit board 11 through the heat reception block 36, the fixing member 38, and the first fixing member 53. The heat pipe 52 supports a second area 11c of the circuit board 11 through the second fixing member 54.

The extension part 41 extends from the lower face of the fit part 56 toward the circuit board 11. The joint parts 42 extend from the lower end of the extension part 41 and are joined to the conductor layers 23 and 24. The fixing method of the joint parts 42 to the conductor layers 23 and 24 is not limited to soldering and the joint parts 42 may be fastened to the conductor layers 23 and 24 with a screw, for example, as shown in FIG. 6.

According to the described portable computer 51, the circuit board 11 is reinforced and the cooling efficiency of a heating part 21 improves. That is, if the fixing members 53 and 54 are included instead of providing the heat pipe with attachment parts 33 and 34, the circuit board 11 can be reinforced and the heating part 21 can be cooled as with the portable computer 1 according to the first embodiment.

That is, the circuit board 11 is reinforced by the rigidity of the heat pipe 52. A part of the heat generated from the heating part 21 is diffused in the circuit board 11 and is dissipated from the circuit board 11, so that the cooling efficiency of the heating part 21 improves. Further, the portable computer 51 for which unnecessary radio wave countermeasures and static electricity countermeasures are taken can be provided.

When the heat pipe 52 supports both the first area 11b and the second area 11c of the circuit board 11, concentrating of the stress applied to the first or second area 11b or 11c on the narrow portion 11a is suppressed.

Next, a portable computer 61 as an electronic machine according to a third embodiment of the invention will be discussed with reference to FIGS. 10 to 12. Components identical with those of the portable computer 1 according to the first embodiment are denoted by the same reference numerals in the third embodiment and will not be discussed again.

Figure 10:
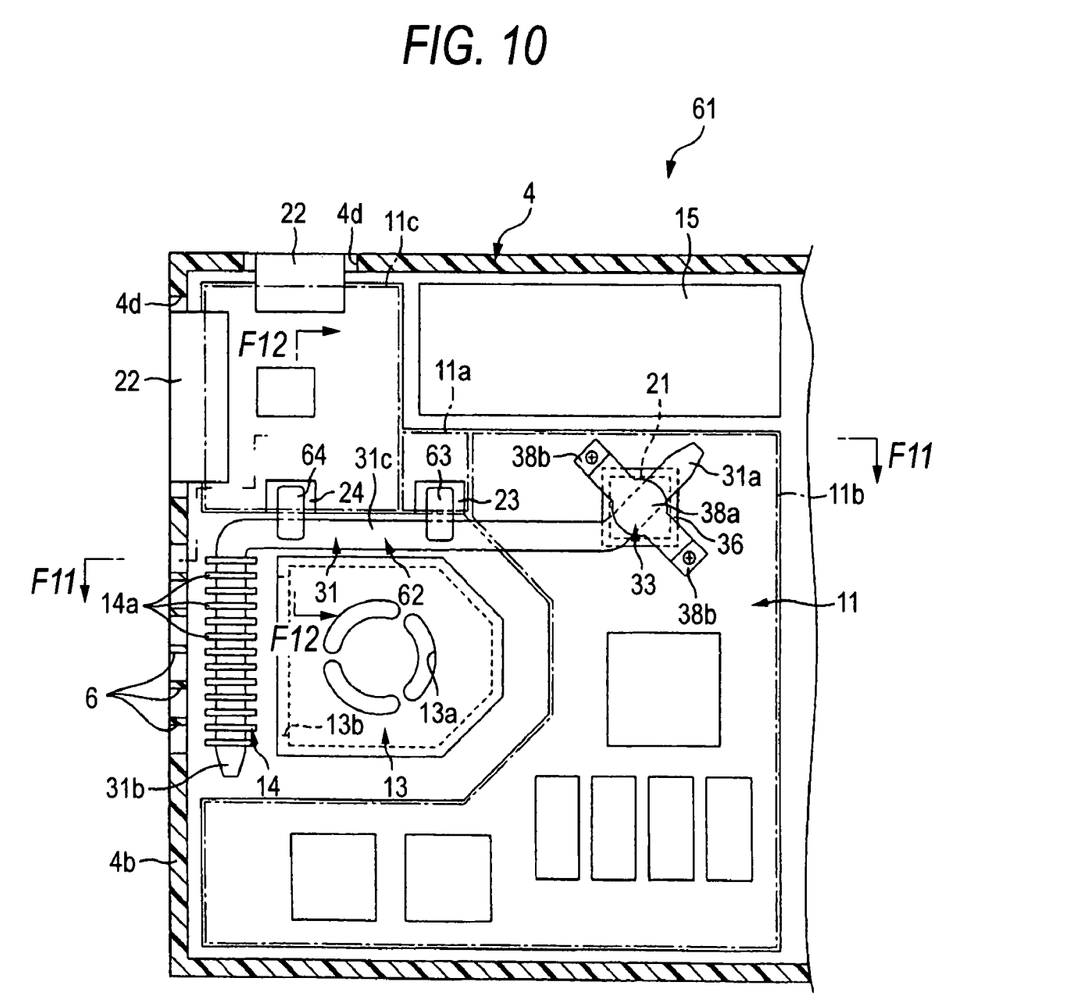
FIG. 10 is an exemplary sectional view of a portable computer according to a third embodiment of the invention.
Figure 11:
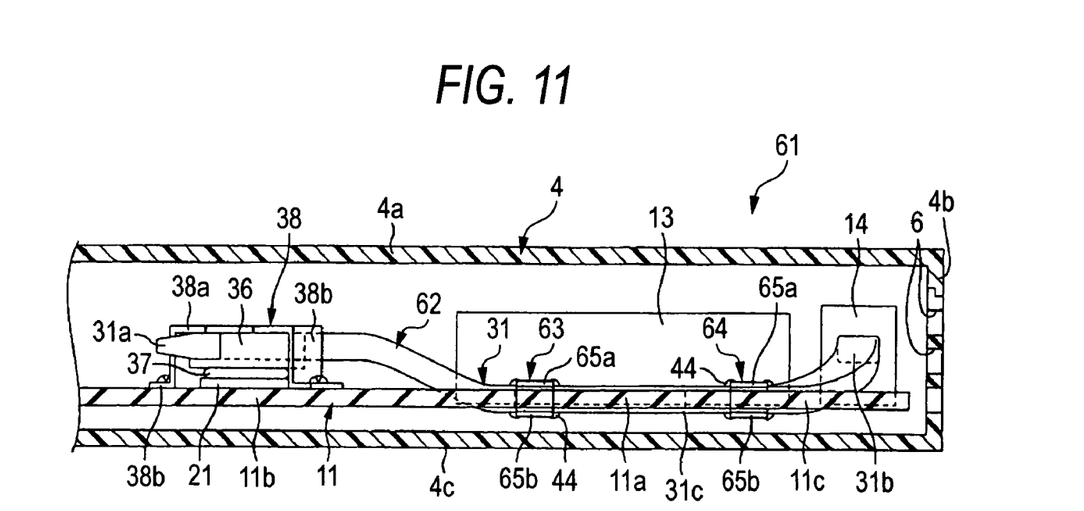
FIG. 11 is an exemplary sectional view of the portable computer taken along line F11-F11 in FIG. 10.

As shown in FIG. 10, a cabinet 4 of the portable computer 61 houses a circuit board 11, a cooling fan 13, a heat dissipation member 14, and a heat pipe 62. A first conductor layer 23 is provided in a narrow portion 11a of the circuit board 11. A second conductor layer 24 is provided in a second area 11c of the circuit board 11. As shown in FIG. 12, the first and second conductor layers 23 and 24 are provided on the upper face and the lower face of the circuit board 11.

The heat pipe 62 has a main body 31 and first and second attachment parts 63 and 64. A first end part 31a of the main body 31 is attached to the circuit board 11 by means of a heat reception block 36 and a fixing member 38 and supports a first area 11b of the circuit board 11 through the fixing member 38.

As shown in FIG. 10, the main body 31 of the heat pipe 62 extends along a side of the narrow portion 11a of the circuit board 11. As shown in FIGS. 11 and 12, the main body 31 has a center part 31c bent so as to align with the circuit board 11 along the parallel direction with the plane of the circuit board 11. A second end part 31b of the main body 31 is again bent upward and has at least the same height as the first end part 31a.

The first and second attachment parts 63 and 64 of the heat pipe 62 are provided in the center part 31c of the main body 31. The first attachment part 63 is provided at a position opposed to the first conductor layer 23 provided on the circuit board 11. The second attachment part 64 is provided at a position opposed to the second conductor layer 24 provided on the circuit board 11. The first and second attachment parts 63 and 64 are formed of the same material as the container of the main body 31, namely, a copper alloy.

Figure 12:
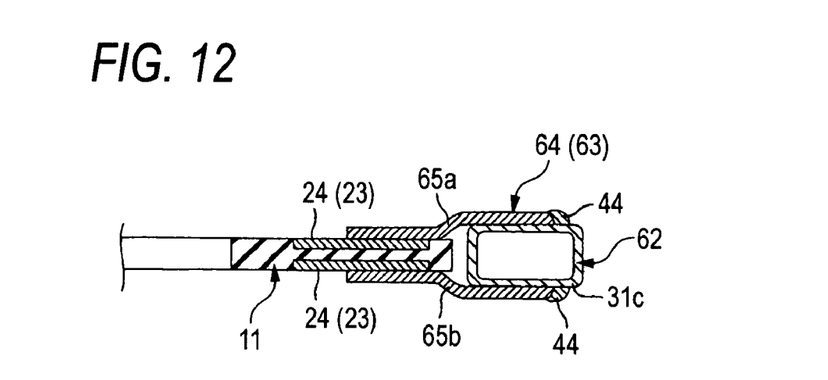
FIG. 12 is an exemplary sectional view of the portable computer taken along line F12-F12 in FIG. 10.

As shown in FIG. 12, each of the first and second attachment parts 63 and 64 has a pair of first and second arm parts 65a and 65b. The first arm part 65a is fixed to the upper face of the main body 31 and also extends toward the circuit board 11. The second arm part 65b is fixed to the lower face of the main body 31 and also extends toward the circuit board 11. That is, the first and second attachment parts 63 and 64 are formed each like a clip shape. The fixing method of the first and second arm parts 65a and 65b to the main body 31 is soldering by way of example, but is not limited to soldering. The first and second arm parts 65a and 65b may be attached to the main body 31 by welding, for example, or may be molded integral with the main body 31.

The tips of the first and second arm parts 65a and 65b are narrow so that their gap becomes a little smaller than the thickness of the circuit board 11. Accordingly, if the first and second attachment parts 63 and 64 are pressed against the circuit board 11 from a side, the circuit board 11 is sandwiched between the first and second arm parts 65a and 65b. That is, the first and second attachment parts 63 and 64 are fitted into the circuit board 11, whereby the heat pipe 62 is fixed to the circuit board 11.

The first and second attachment parts 63 and 64 are in contact with the conductor layers 23 and 24. Accordingly, the heat pipe 62 is thermally and electrically connected to the first and second conductor layers 23 and 24. That is, the heat pipe 62 is grounded to the conductor layers 23 and 24 through the attachment parts 63 and 64. The heat pipe 62 is connected to the conductor layers 23 and 24 formed on the upper face and the lower face of the circuit board 11, whereby the ground strength improves as compared with the case where the heat pipe 62 is connected to the conductor layer formed on one face, for example.

The heat pipe 62 is fixed directly or indirectly to the circuit board 11 at the three points of the first end part 31a, the first attachment part 63, and the second attachment part 64. The heat pipe 62 is connected to the narrow portion 11a, the first area 11b, and the second area 11c of the circuit board 11. Accordingly, the heat pipe 62 supports the first area 11b of the circuit board 11 through the heat reception block 36 and the fixing member 38, supports the narrow portion 11a through the conductor layer 23, and supports the second area 11c through the conductor layer 24.

According to the described portable computer 61, the circuit board 11 is reinforced and the cooling efficiency of the heating part 21 also improves. That is, the circuit board 11 is reinforced by the rigidity of the heat pipe for a similar reason to that previously described in the portable computer 1 according to the first embodiment. Further, a part of the heat generated from the heating part 21 is diffused in the circuit board 11 and is dissipated from the circuit board 11, so that the cooling efficiency of the heating part 21 improves. Further, the portable computer 61 for which unnecessary radio wave countermeasures and static electricity countermeasures are taken can be provided.

When the heat pipe 62 is fixed to the first area 11b and the second area 11c of the circuit board 11, concentrating of the stress applied to the first or second area 11b or 11c on the narrow portion 11a is suppressed.

If the first and second attachment parts 63 and 64 fitted into the circuit board 11 are included as in the third embodiment, the time and labor for soldering the first and second attachment parts 63 and 64 to the first and second conductor layers 23 and 24 or fastening the first and second attachment parts 63 and 64 to the first and second conductor layers 23 and 24 with a screw can be omitted. This contributes to improvement of the assembly capability of the portable computer 61.

The heat pipe 62 may be fixed to the conductor layers 23 and 24 using a separate fixing member as in the second embodiment instead of providing the attachment parts 63 and 64 as a part of the heat pipe 62. If a separate fixing member is used, a similar reinforcement effect and a similar cooling effect can be provided.

Figure 14:
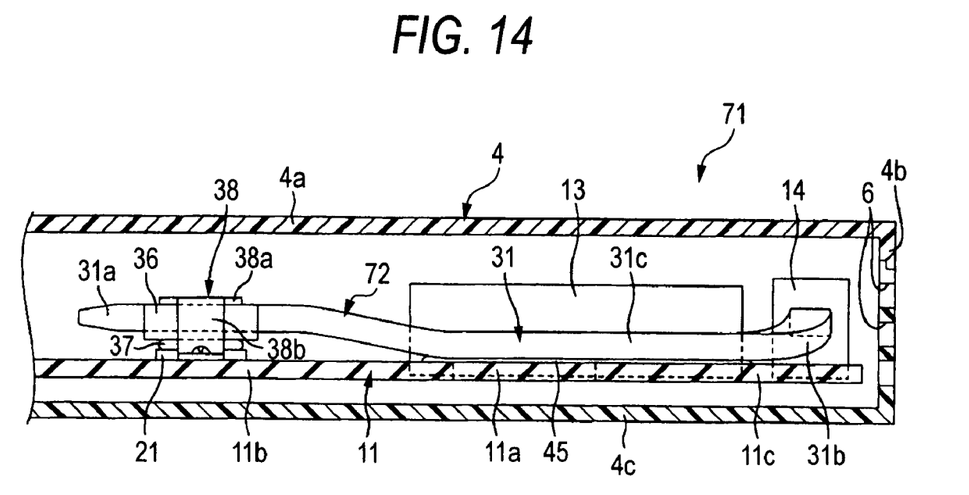
FIG. 14 is an exemplary sectional view of the portable computer taken along line F14-F14 in FIG. 13.
Figure 15:
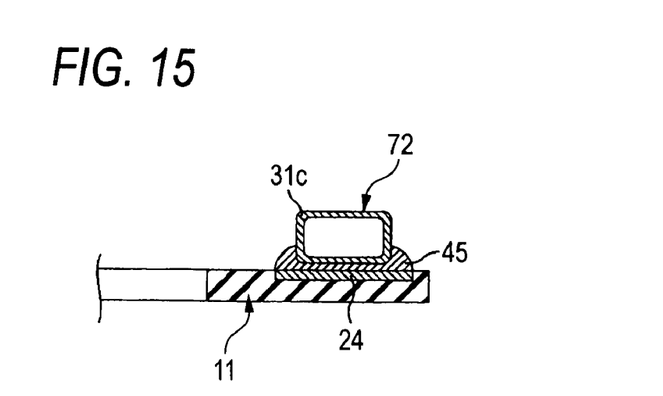
FIG. 15 is an exemplary sectional view of the portable computer taken along line F15-F15 in FIG. 13.

Next, a portable computer 71 as an electronic machine according to a fourth embodiment of the invention will be discussed with reference to FIGS. 13 to 15. Components identical with those of the portable computer 1 according to the first embodiment are denoted by the same reference numerals in the fourth embodiment and will not be discussed again.

Figure 13:
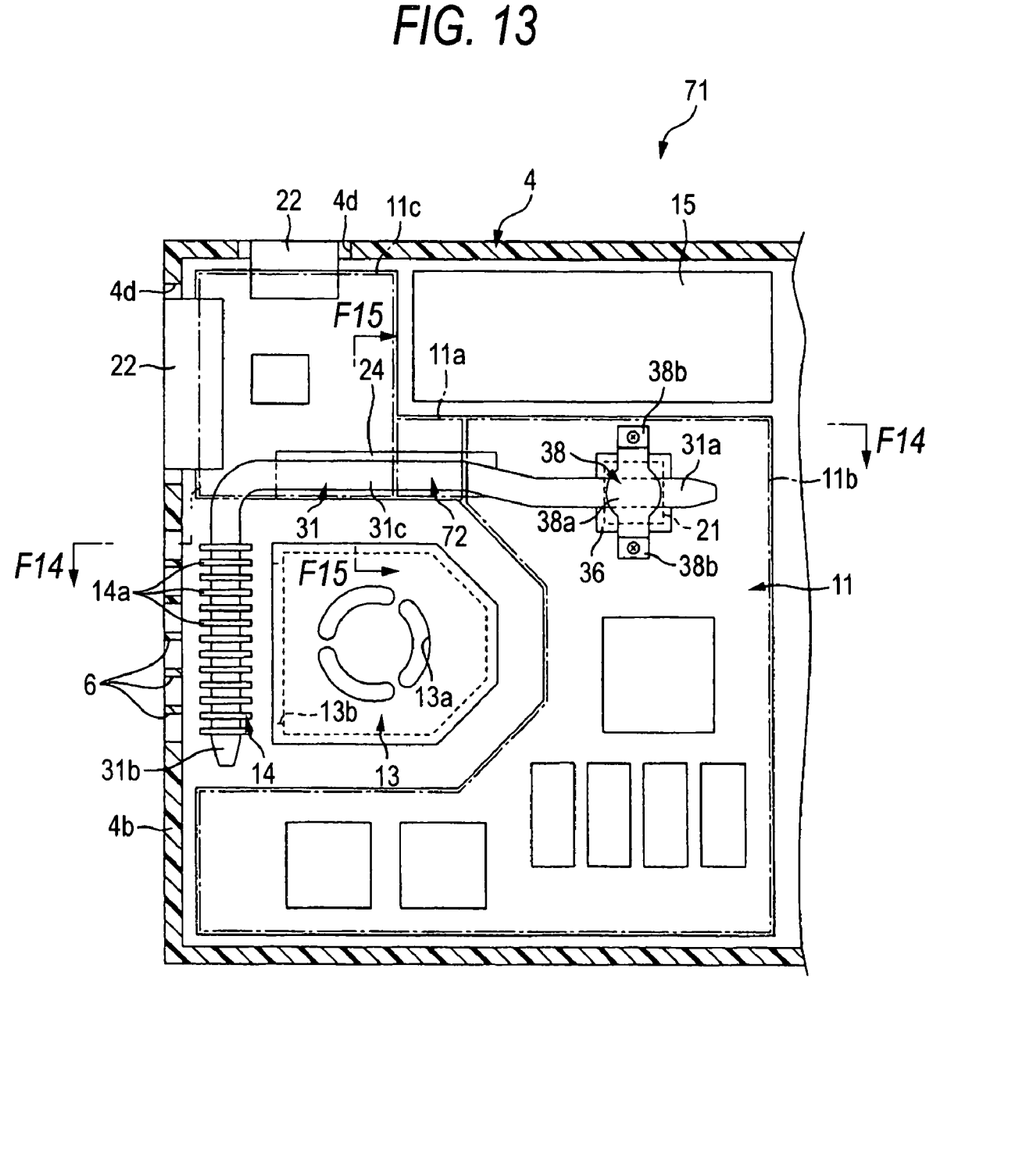
FIG. 13 is an exemplary sectional view of a portable computer according to a fourth embodiment of the invention.

As shown in FIG. 13, a cabinet 4 of the portable computer 71 houses a circuit board 11, a cooling fan 13, a heat dissipation member 14, and a heat pipe 72. The heat pipe 72 has a main body 31. A first end part 31a of the main body 31 is attached to the circuit board 11 by means of a heat reception block 36 and a fixing member 38 and supports a first area 11b of the circuit board 11 through the fixing member 38.

As shown in FIG. 13, on the circuit board 11, a conductor layer 24 is formed from a narrow portion 11a to a second area 11c. The main body 31 of the heat pipe 72 extends along the narrow portion 11a of the circuit board 11. As shown in FIG. 14, the main body 31 has a center part 31c bent so as to come in contact with the conductor layer 24. A second end part 31b of the main body 31 is again bent upward and has at least the same height as the first end part 31a.

The main body 31 of the heat pipe 72 is soldered to the conductor layer 24 by soldering 45, for example. The main body 31 of the heat pipe 72 is joined to the conductor layer 24. The heat pipe 72 is connected to the narrow portion 11a through the conductor layer 24 for supporting the narrow portion 11a. However, the fixing method of the heat pipe 72 is not limited to soldering.

According to the described portable computer 71, the circuit board 11 is reinforced and the cooling efficiency of the heating part 21 also improves. That is, the circuit board 11 is reinforced by the rigidity of the heat pipe 72 for a similar reason to that previously described in the portable computer 1 according to the first embodiment. Further, a part of the heat generated from the heating part 21 is diffused in the circuit board 11 and is dissipated from the circuit board 11, so that the cooling efficiency of the heating part 21 improves. Further, the portable computer 71 for which unnecessary radio wave countermeasures and static electricity countermeasures are taken can be provided. When the heat pipe 72 is fixed to the narrow portion 11a, the narrow portion 11a is directly reinforced.

The portable computers 1, 51, 61, and 71 according to the first to fourth embodiments have been described, but the invention is not limited to the specific embodiments. For example, the heat pipe is not limited to that for reinforcing the narrow portion 11a of the circuit board 11. For example, the heat pipe according to the embodiments of the invention may be a heat pipe for reinforcing a circuit board having no narrow portion. The embodiments of the invention can be applied to various circuit boards and the heat pipe may be attached appropriately so as to reinforce the part whose reinforcement is desired.

For example, the heat reception block 36 is not necessarily required, and the first end part 31a of the heat pipe 12, 52, 62, 72 may be attached directly to the heating part 21 and the heat transfer member 37. The invention can be applied not only to portable computers as electronic machines, but also to various electronic machines such as a mobile telephone, a digital camera, and a video camera, for example.

As described with reference to the embodiment, there is provided an electronic apparatus intended for reinforcing a circuit board and improving the cooling efficiency of a heating part.

While certain embodiments of the inventions have been described, these embodiments have been presented by way of example only, and are not intended to limit the scope of the inventions. Indeed, the novel systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:
    a housing;
    a circuit board that is housed in the housing, the circuit board includes a narrow portion, a first portion, and a second portion, the first portion being connected to the second portion through the narrow portion;
    a heat generation portion that is mounted on the first portion of the circuit board;
    a heat radiation portion that is housed in the housing;
    a first conductor layer that is provided on the second portion of the circuit board;
    a heat reception portion that is thermally connected to the heat generation portion;
    a heat pipe that is fixed to and grounded via the first conductor layer; and
    a fixing member that mounts the heat reception portion on the circuit board,
    wherein the heat pipe includes a first end portion fixed to the heat reception portion, and a second end portion thermally connected to the heat radiation portion, and the heat pipe supports the first portion via the fixing member and supports the second portion via the first conductor layer.

2. The electronic apparatus according to claim 1,
    wherein the heat pipe includes:
    a main body that is arranged to have a gap from the circuit board, the main body being circulated with a liquid refrigerant there through; and
    a first attachment portion that extends from the main body to the circuit board and is attached to the first conductor layer.

3. The electronic apparatus according to claim 2, further comprising a second conductor layer provided on the first portion,
    wherein the heat pipe includes a second attachment portion extending from the main body to the circuit board and is attached to the second conductor layer.

4. The electronic apparatus according to claim 3,
    wherein the heat pipe is soldered to the first conductor layer and the second conductor layer.

5. The electronic apparatus according to claim 4,
    wherein the first attachment portion and the second attachment portion are made of the same material as the main body of the heat pipe.

6. The electronic apparatus according to claim 1,
    wherein the heat pipe includes:
    a main body that is arranged along a edge of the circuit board, the main body being circulated with a liquid refrigerant; and
    an attachment portion that extends from the main body to the circuit board and is attached to the circuit board and is configured to contact to the first conductor layer.

7. The electronic apparatus according to claim 1,
    wherein the circuit board includes a narrow portion,
    wherein the conductor layer is provided on the narrow portion, and
    wherein the heat pipe supports the first portion via the fixing member and supports the narrow portion via the conductor layer.

8. The electronic apparatus according to claim 7,
    wherein the heat pipe includes a main body that is attached to the conductor layer, the main body being circulated with a liquid refrigerant.

9. An electronic apparatus comprising:
    a housing;
    a circuit board that is housed in the housing and having a narrow portion, a first portion, and a second portion, the first portion being connected to the second portion through the narrow portion;
    a first conductor layer that is provided on the first portion;
    a second conductor layer that is provided on the second portion;
    a heat generation portion that is mounted on the circuit board;
    a heat radiation portion that is housed in the housing; and
    a heat pipe that is having a first end portion thermally connected to the heat generation portion and a second end portion thermally connected to the heat radiation portion and is attached to the first conductor layer and the second conductor layer.

10. The electronic apparatus according to claim 9,
    wherein the heat pipe including:
    a main body that is arranged to have a gap from the circuit board, the main body being circulated with a liquid refrigerant there through;
    a first attachment portion that extends from the main body to the circuit board and is attached to the first conductor layer; and
    a second attachment portion that extends from the main body to the circuit board and is attached to the second conductor layer.

11. An electronic apparatus comprising:
    a housing;
    a circuit board that is housed in the housing;

a heat generation portion that is mounted on the circuit board;

a heat radiation portion that is housed in the housing;

a first conductor layer that is provided on the circuit board;

a heat reception portion that is thermally connected to the heat generation portion;

a heat pipe that is arranged to have a gap from the circuit board, and includes a first end portion fixed to the heat reception portion and a second end portion thermally connected to the heat radiation portion;

a first fixing member that mounts the heat reception portion on the circuit board; and a second fixing member that is disposed between the heat pipe and the circuit board, the second fixing member thermally connecting the heat pipe to the first conductor layer and fixing the heat pipe to the first conductor layer.

12. The electronic apparatus according to claim 11, wherein the circuit board is having a narrow portion, a first portion, and a second portion, the first portion being connected to the second portion through the narrow portion;

wherein the heat generation potion is mounted on the first portion;

wherein the conductor layer is provided on the second portion; and wherein the heat pipe supports the first portion via the first fixing member and supports the second portion via the second fixing member and the conductor layer.

* * * * *